United States Patent [19]

Hshieh

[11] Patent Number: 4,931,408
[45] Date of Patent: Jun. 5, 1990

[54] METHOD OF FABRICATING A SHORT-CHANNEL LOW VOLTAGE DMOS TRANSISTOR

[75] Inventor: Fwu-Iuan Hshieh, San Jose, Calif.
[73] Assignee: Siliconix Incorporated, Santa Clara, Calif.
[21] Appl. No.: 420,971
[22] Filed: Oct. 13, 1989
[51] Int. Cl.$^5$ .......................................... H01L 21/266
[52] U.S. Cl. .................................. 437/44; 437/150; 437/29; 437/41; 148/DIG. 126; 148/DIG. 131; 357/23.4
[58] Field of Search ............... 437/44, 30, 41, 150, 437/152, 153, 29, 158; 357/23.4; 148/DIG. 1226, DIG. 131

[56] References Cited

U.S. PATENT DOCUMENTS

| | | | |
|---|---|---|---|
| 4,443,931 | 4/1984 | Baliga et al. | 437/41 |
| 4,503,598 | 3/1985 | Vora et al. | 437/41 |
| 4,774,198 | 9/1988 | Contiero et al. | 437/30 |
| 4,810,665 | 3/1989 | Chang et al. | 437/30 |

FOREIGN PATENT DOCUMENTS 59-74674  4/1984  Japan ..................... 437/44
63-244777 10/1988 Japan ..................... 357/23.4

Primary Examiner—Brian E. Hearn
Assistant Examiner—T. N. Quach
Attorney, Agent, or Firm—Skjerven, Morrill, MacPherson, Franklin & Friel

[57] ABSTRACT

An oxide sidewall spacer is formed on the sidewalls of a gate prior to forming the body region of a DMOS transistor. An ion implantation or diffusion process is then conducted to form the body region, where the gate and the oxide sidewall spacer together act as a mask for self-alignment of the body region. After a drive-in step to diffuse the impurities, the body region will extend only a relatively short distance under the gate due to its initial spacing from the edge of the gate. After the body region is formed, the oxide sidewall spacer is removed, and impurities to form the source region are implanted or diffused into the body region and driven in. Since the extension of the body region under the gate is limited by the oxide sidewall spacer, the channel region between the edge of the source region and the body region under the gate may be made shorter resulting in the channel on-resistance of the transistor being reduced.

5 Claims, 3 Drawing Sheets

METHOD OF FABRICATING A SHORT-CHANNEL LOW VOLTAGE DMOS TRANSISTOR

FIELD OF THE INVENTION

This invention relates to double diffused metal-oxide-semiconductor (DMOS) transistors, and in particular to a method of forming a DMOS transistor which enables the formation of short channels, resulting in a lowering of on-resistance.

BACKGROUND OF THE INVENTION

In a DMOS transistor, the channel region of the transistor is inverted by an appropriate voltage applied to gate insulated from and overlying the channel. The inverted channel forms an ohmic path between two semiconductor regions of a same conductivity type separated by the channel.

A major contributor to on-resistance of low voltage DMOS transistors is channel resistance. For a low voltage DMOS transistor it is therefore desirable to fabricate the DMOS transistor so as to have a short channel so that the channel resistance does not unduly contribute to the on-resistance of the device.

In the formation of conventional DMOS transistors, it is well known to use a formed gate as a mask when doping a surface of a silicon substrate to form the body region and source region. This enables the body region and source region to be self-aligned with the gate. This well known process is generally shown in FIGS. 1-3, wherein FIG. 1 shows P-type boron ions 2 being implanted in N- epitaxial layer 3, formed over N+ substrate 4, to subsequently form the body regions of a vertical DMOS transistor. As seen in FIG. 1, gate 5 and thick oxide regions 10 provide a mask during the implantation of the P-type ions so that the body regions will be self-aligned with the gate. Previously formed P+ regions 12 act as contact regions for the body regions.

The implanted P-type ions are then driven in at a high temperature to achieve the desired diffusion of the P-type ions, shown in FIG. 2, in N- epitaxial 3 and under gate 5.

In FIG. 2, a conventional masking and etching step is used to expose surface portions 16 of P- body regions 14 for implantation or diffusion thereinto of N-type impurities, such as phosphorous or arsenic, using gate 5 and etched thick oxide 17 as a mask.

In FIG. 3, a drive-in step is then conducted to form relatively shallow N+source regions 18 within P- body regions 14 so that N+source regions 18 extend under gate 5 but remain totally within P- body regions 14.

As previously stated, for low voltage DMOS devices, the channel regions 20 under gate 5 are desired to be short to achieve a low on-resistance while still preventing breakdown of the narrow P- body regions when the DMOS transistor is in its off condition.

One way to achieve a short channel is to form a shallow P- body region by implanting P-type ions at low energy and then performing a short drive-in step, or a drive-in step at a relatively low temperature. The limited drive-in of the P-type impurities results in a limited diffusion of the P-type impurities under the gate, while enabling good control of the resulting impurity concentration of the P-body region.

A subsequent implantation or diffusion of N-type impurities into the shallow P- body region and drive-in of these impurities will result in a short channel, since the diffusion of the P-type impurities under the gate was restricted by the limited drive-in of the P-type impurities.

Using this prior art method of forming a shallow P-body region results in the shallow P- body region having a relatively high resistance Rb as compared to deeper body regions formed using the same impurity dose.

FIG. 4 shows a partial cross-section of a DMOS transistor with a shallow P- body region 26 and a short channel 28. Since, typically, N+ source region 30 and P-body region 26 are shorted together by a source electrode (not shown) to prevent the PN junction of the P-body region and N+ source region from becoming forward biased, this high resistance of the shallow P-body region 26 causes a voltage differential across P-body region 26 when any current flows through P-body region 26. If the current is large enough, the voltage differential may be sufficient to turn on the parasitic NPN bipolar transistor comprising N+ emitter 30, P-base 26, and N- collector 3. This high resistance of shallow P- body region 26 also undesirably contributes to a high beta of the parasitic NPN bipolar transistor and the increased likelihood of latch-up of the device.

A process is needed for fabricating a low voltage rugged DMOS transistor with a short channel which enables a relatively deep P- body region to be formed while using the gate as a mask for self-aligning the P-body region.

SUMMARY OF THE INVENTION

A process for fabricating a low voltage rugged DMOS transistor with a short channel is described herein. In this novel DMOS transistor, the body region of the transistor may be formed deeper while still enabling a short channel. The increased depth of the body region lowers the resistance of the body region, while the short channel lowers the on-resistance of the transistor for improved performance of the DMOS transistor.

To achieve these results, an oxide sidewall spacer is formed on the sidewalls of the gate prior to forming the body region. An ion implantation or diffusion process is then conducted to form the body region, where the gate and the oxide sidewall spacer together act as a mask for self-alignment of the body region. Consequently, the impurities forming the body region will be implanted or diffused into the silicon substrate at a distance from the edge of the gate, as determined by the width of the oxide sidewall spacer. After a drive-in step to diffuse the impurities, the body region will extend only a relatively short distance under the gate due to its initial spacing from the edge of the gate.

After the body region is formed, the oxide sidewall spacer is removed, and impurities to form the source region are implanted or diffused into the body region and driven in so that the source region extends under the gate but is still entirely within the body region.

Since the extension of the body region under the gate is less than in the prior art, the channel region between the edge of the source region and the body region under the gate may be made shorter, resulting in the channel on-resistance of the transistor being reduced.

DETAILED DESCRIPTION OF THE PREFERRED EMBODIMENT

Figure 1:
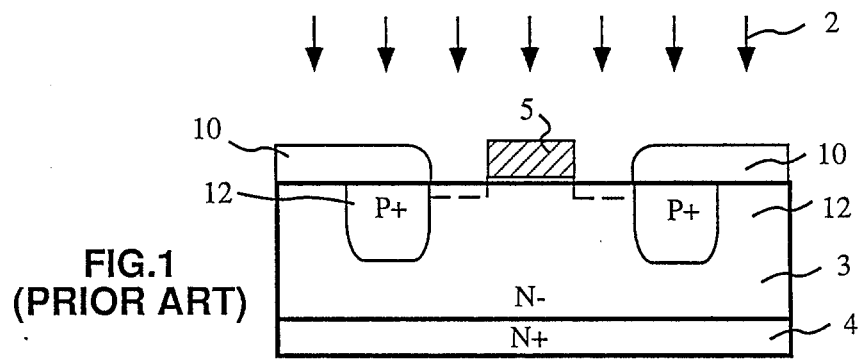
FIGS. 1-3 are cross-sections of a conventional DMOS transistor during various steps in its formation.
Figure 2:
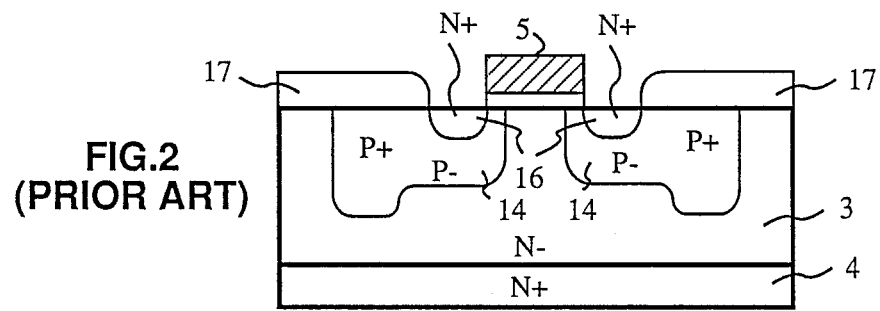
Figure 3:
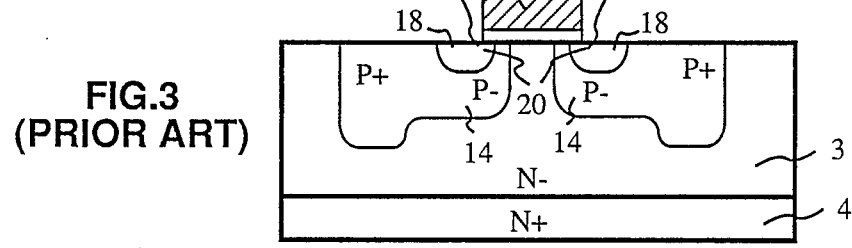
Figure 4:
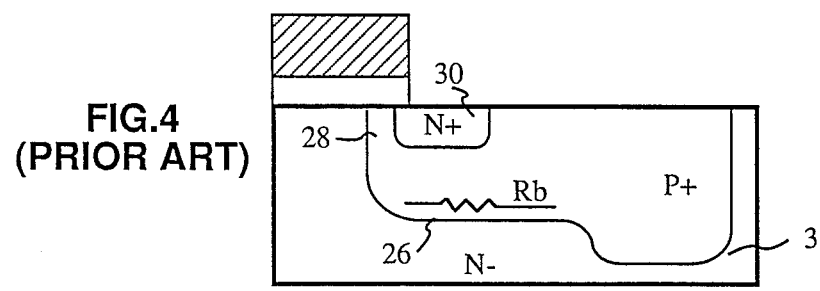
FIG. 4 is a cross-section of a conventional DMOS transistor having a shallow body region to enable the formation of a short channel for reduced channel on-resistance.
Figure 5:
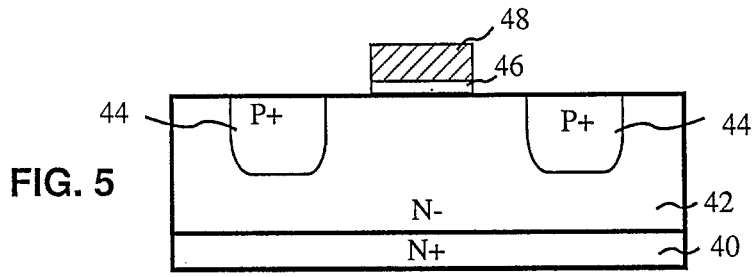
FIGS. 5–10 are cross-sections of the DMOS transistor fabricated in accordance with the preferred embodiment of the invention during various stages of its fabrication.

FIG. 5 shows a partially formed DMOS transistor in accordance with one embodiment of the invention. In FIG. 5, N+ semiconductor substrate 40 has deposited on its surface N- epitaxial layer 42 using conventional and well-known techniques. This starting structure is used if a vertical DMOS transistor is desired to be formed. If a lateral DMOS transistor is desired to be formed, the substrate would be an N- type material, and a diffused N+ substrate contact region would be formed on the surface of the N- substrate to act as a drain. In FIG. 5, N+ substrate 40 acts as a drain contact. Opposite conductivity types may also be used while still achieving the advantages of this invention.

In one embodiment, N+ substrate 40 has a conductivity in the range of 0.001 ohm·cm, and N- epitaxial layer 42 has a conductivity in the range 0.5–2.0 ohm·cm. The conductivity and thickness of epitaxial layer 42 depend on the device requirements for on-resistance and breakdown voltage. In the preferred embodiment, the thickness of epitaxial layer 42 is approximately 6 microns.

P-type impurities, such as boron, are then implanted or otherwise introduced into the surface of epitaxial layer 42, after conducting a conventional masking and etching step, to form P+ body contact regions 44 to a depth of approximately 3 microns with a concentration of approximately $3 \times 10^{19}$ atoms/cm$^3$.

Over N- epitaxial layer 42 and P+ contact regions 44 is grown or deposited gate oxide layer 46 to approximately 1000 Å thick using conventional and well-known techniques.

Next, to form a gate, a layer of doped polysilicon with a sheet resistance of approximately 15 ohms/square and 4000 Å thick is deposited on the surface of the wafer over gate oxide layer 46. A masking and etching step, using conventional techniques, is used to define gate 48 and gate oxide 46. This masking and etching step also exposes the surface of epitaxial layer 42.

Figure 6:
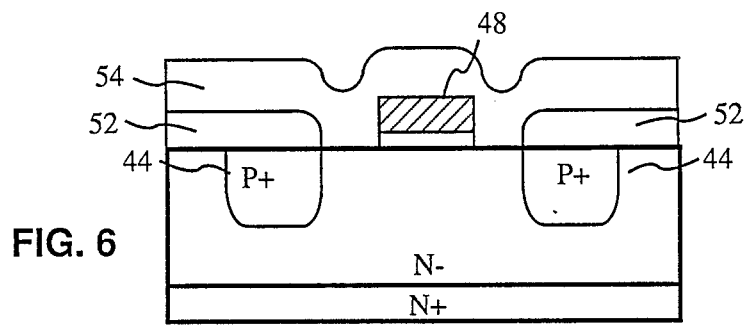

Next, as shown in FIG. 6, on the surface of the wafer is grown a layer of SiO$_2$ to a nominal thickness of 5000 Å. The SiO$_2$ is then etched to form oxide regions 52 so as to expose the surface of epitaxial layer 42 between P+ contact regions 44 and gate 48.

A second oxide layer 54 is then grown or deposited over the entire surface of the wafer to a nominal thickness of 5000 Å.

Figure 7:
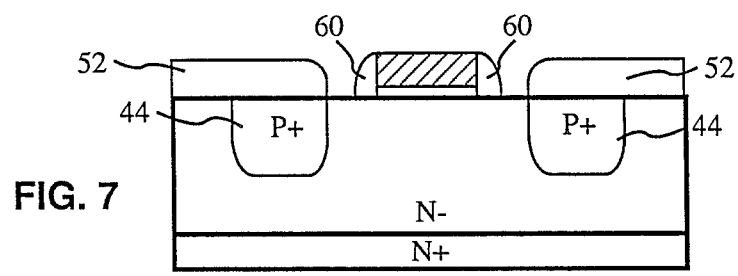

In FIG. 7, an anisotropic dry etch, such as a reactive etch or plasma etch, is used without a mask to vertically etch oxide layer 54 so as to leave oxide sidewall spacer regions 60 on the sidewalls of gate 48. If larger or smaller sidewalls are desired, the thickness of oxide layer 54 can be varied to increase or decrease the width of the sidewalls and, hence, increase or decrease the resulting channel length.

Figure 8:
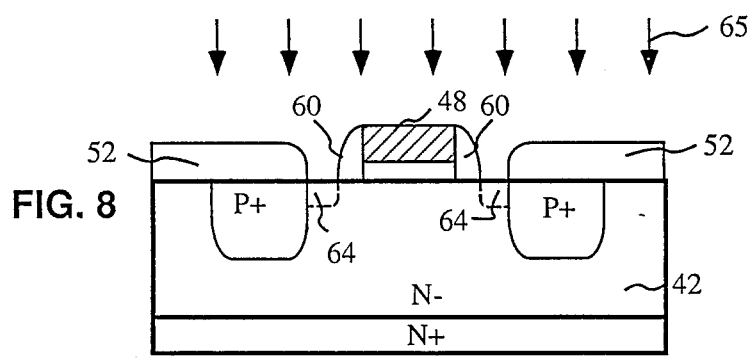

Oxide sidewall spacers 60 will now serve as a mask, along with gate 48 and etched oxide layer 52, during the next step of implanting P-type impurities to form the body region 64, shown in FIG. 8.

In FIG. 8, a blanket ion implantation of boron ions 65 is conducted at an energy level of approximately 60 KeV at a dosage of approximately $2 \times 10^{14}$ ions/cm$^2$, using conventional techniques, to implant P-type impurities into epitaxial layer 42 to a depth of approximately 1.5 microns. The implant energy and dosage of the implanted ions are determined by the desired breakdown voltage of the device.

As seen in FIG. 8, even though body regions 64 are self-aligned with the gate 48, the edges of P- body regions 64 are spaced away from the edges of gate 48, with the spacing being determined by the thickness of oxide sidewall spacer regions 60.

Figure 9:
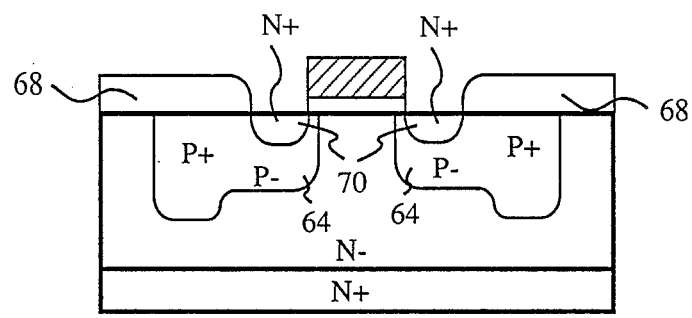

In FIG. 9, the remaining oxide on the surface of the substrate including oxide sidewall spacer regions 60 is removed by, for example, subjecting the wafer to an acid bath for a period to remove all the exposed oxide from the surface of the wafer. However, any well known and conventional technique for removing oxide may be used.

The P-type impurities implanted into epitaxial layer 42 are then driven in at approximately 1150° C. for a period of 15–30 minutes to form P- body regions 64 having an edge slightly under gate 48, as shown in FIG. 9. Of course, a lower drive-in temperature and increased drive-in time would achieve similar results. The extension of P- body regions 64 under gate 48 determines the channel length of the completed DMOS transistor.

Next, oxide layer 68 is grown or deposited on the surface of the wafer, and a conventional masking and etching step is used to expose a surface portion of the P-body regions 64 for infusion of N-type impurities thereinto to form N+ source regions 70. In a preferred embodiment, N+ source regions 70 are formed by diffusion of phosphorus or arsenic atoms to a depth of approximately 0.5 microns and have a concentration of on the order of $10^{20}$ atoms/cm$^3$.

Figure 10:
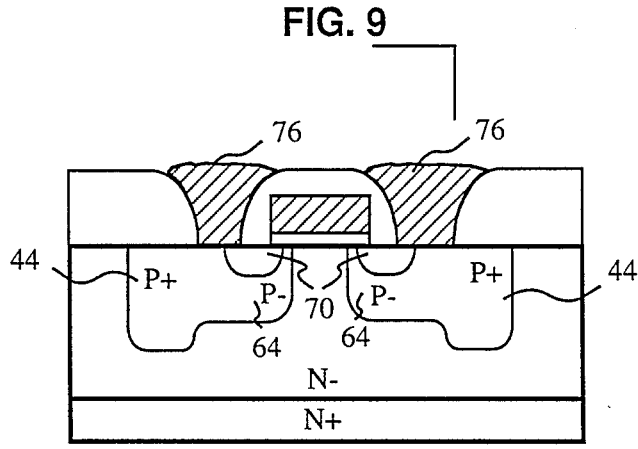

In FIG. 10, the impurities in N+ source region 70 are driven in, which also results in the P-type impurities in P-body regions 64 being further driven in. Oxide layer 76 is then deposited and etched to expose contact regions to the silicon surface. Metal contacts contacting N+ source regions 70 and P+ body contact regions 44 are then formed, which short body regions 64 to source regions 70.

The resulting DMOS transistor of FIG. 10 may also be formed using impurities of opposite conductivity types as described above, thus forming a P channel type DMOS transistor.

A variety of well-known methods may be used to form oxide sidewall spacer 60 and the various other regions of the DMOS transistor of FIG. 10, as will be apparent to those of ordinary skill in the art.

Figure 11:
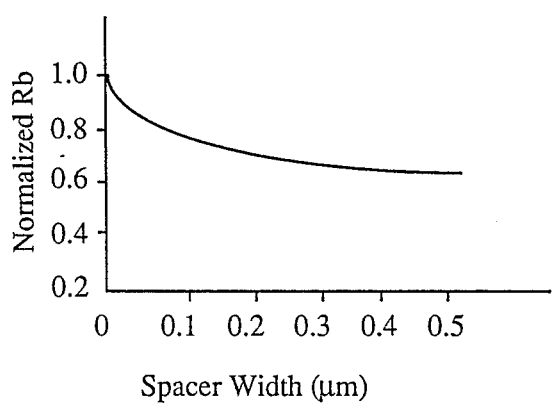
FIG. 11 is a graph showing the normalized body resistance versus the oxide sidewall spacer width.

FIG. 11 shows normalized body resistance $R_b$ versus width of the oxide sidewall spacer. The relationship shown in the graph was obtained from a Suprem III ™ simulation. As seen, the $R_b$ can be reduced to about 65% using a 0.3 micron oxide sidewall spacer.

The above-described method enables P body regions 64 to be formed deeper while enabling a limited diffusion of body region impurities under the gate in order to form a DMOS transistor having a short channel. Due to the relatively large depth of P body regions 64, their resistance is made relatively low so as to produce a more rugged DMOS transistor with lower on-resistance than prior art DMOS transistors.

Although the DMOS transistor of FIG. 10 is a vertical transistor, a lateral DMOS transistor, having a topside substrate contact, can also be fabricated using oxide sidewall spacers and the method described above.

While specific embodiments have been disclosed in this Specification, these embodiments are merely illustrative of my invention and are not to be construed as a limitation of my invention. Other embodiments of my invention will become apparent to those skilled in the art in light of the teachings of this Specification.

What is claimed is:

1. A method of forming a DMOS transistor having a short channel comprising the steps of:
    forming a gate oxide layer over a surface of a semiconductor material of a first conductivity type;
    forming a conductive gate over said gate oxide layer;
    forming an oxide sidewall spacer on a sidewall of said gate by forming a first oxide layer over said gate and over a top surface of said semiconductor material and etching said first oxide layer so as to leave said oxide sidewall spacer;
    introducing impurities of a second conductivity type into said semiconductor material to form a body region of said second conductivity type while using said gate and said oxide sidewall spacer as a mask to self-align said body region with said gate;
    removing said oxide sidewall spacer;
    introducing impurities of said first conductivity type into said body region after removal of said sidewall spacer to form a source region of said first conductivity type on and below a surface of said body region while using said gate as a mask to self-align said source region; and
    driving in said impurities of a first conductivity type and said impurities of a second conductivity type so as to form a short channel region under said gate.

2. The method of claim 1 wherein said step of forming said oxide sidewall spacer comprises the steps of forming a first oxide layer over said gate and over a top surface of said semiconductor material and anisotropically etching said first oxide layer so as to leave said oxide sidewall spacer.

3. The method of claim 2 wherein said impurities of said second conductivity type used to form said body region are driven in after said step of removing said oxide sidewall spacer.

4. The method of claim 2 further comprising the step of forming a body contact region of said second conductivity type on and below a surface of said semiconductor material prior to forming said gate oxide layer.

5. The method of claim 4 wherein said step of forming said oxide sidewall spacer further comprises the steps of depositing a second oxide layer on the top surface of said semiconductor material, and masking and etching said second oxide layer to expose a region of said semiconductor material between said body contact region and said gate, prior to conducting said step of forming a first oxide layer over said gate and over a top surface of said semiconductor material and anisotropically etching said first oxide layer.

* * * * *